United States Patent [19]
Kanai et al.

[11] 4,161,707
[45] Jul. 17, 1979

[54] PUSHBUTTON TUNER HAVING LINKAGE OPERATED TUNING SLIDER

[75] Inventors: Takao Kanai; Yujiro Mori, both of Toda, Japan

[73] Assignee: Clarion Co., Ltd., Tokyo, Japan

[21] Appl. No.: 831,699

[22] Filed: Sep. 9, 1977

[30] Foreign Application Priority Data
Sep. 20, 1976 [JP] Japan ................ 51-111748

[51] Int. Cl.² .............................................. H03J 5/08
[52] U.S. Cl. .................................... 334/7; 74/10.33
[58] Field of Search ............... 74/10.27, 10.33, 10.37, 74/10.9; 334/7

[56] References Cited
U.S. PATENT DOCUMENTS

| | | | |
|---|---|---|---|
| 2,344,091 | 3/1944 | Kirk | 334/7 X |
| 3,680,394 | 8/1972 | Thompson | 334/7 X |
| 4,030,052 | 6/1977 | Pelletier | 334/7 |

*Primary Examiner*—Paul L. Gensler
*Attorney, Agent, or Firm*—Wallenstein, Spangenberg, Hattis & Strampel

[57] ABSTRACT

A pushbutton tuner includes unique linkage means operatively connecting a tuning slider laterally positionable in accordance with the setting of the tuner. A link engaging pin provided on a pushbutton operative member engages with the linkage means upon depression of the pushbutton operative member so as thereby to move the slider depending upon the preset position of the engaging pin.

5 Claims, 2 Drawing Figures

PUSHBUTTON TUNER HAVING LINKAGE OPERATED TUNING SLIDER

BACKGROUND OF THE INVENTION

This invention relates to a pushbutton tuner which may be suitably used for a car radio receiver set. More particularly, it relates to such a tuner having the reduced size of its tuning mechanism.

A pushbutton tuning mechanism essentially comprises (a) operative members each having at its one end a pushbutton and positioned for longitudinal movement from an unoperative position to an operative position in response to the depression of its pushbutton, (b) a tuning slider plate responsive to the movement of the operative member for moving in the direction transversely thereof by the amount peculiar to the respective operative member, and (c) tuning determination means responsive to the movement of the tuning slider plate for providing the corresponding mechanical position of the tuning cores with respect to related stationary coils to determine the reception frequency point peculiar to the respective pushbutton.

In general, in order to make the tuning mechanism compact in size, it is a common practice to arrange the operative members horizontally with respect to the plane of the tuner. However, since each of the operative members is, generally, provided with a frequency presetting cam plate pivotally mounted thereon acting to provide a preset amount of movement of the tuning slider plate in cooperation therewith, and a locking plate for fixedly positioning the cam plate at the preset position, it is impossible with such horizontal arrangement of the operative members to provide all pivotal angular positions of the cam plate for the movements of the slider plate corresponding to a sufficient tuning core stroke to cover a desired frequency band, unless there are great distances between the adjacent operative members. Therefore, even though a tuner having the thin size in height is obtainable, the resulting width thereof would become great, so that it is impossible to make the whole size of the tuner compact.

In the prior art, there have been made many kinds of attempts for accomplishing the thinning and compacting of the tuner simultaneously. For example, in U.S. Pat. No. 2,253,433, a pushbutton tuner is shown wherein operative members arranged horizontally with respect to the plane of the tuner are provided therein V-shaped cutouts respectively. As an operative member is depressed from its unoperative position to the operative position, a pin for the respective operative member provided on the slider operatively coupled to a tuning determination mechanism is moved to a point of the related cutout in the operative member, so that said slider carrying the pins is moved transversely of the moving direction of the operative member. The pins respectively engaging the V-shaped cutouts at the front side of the slider are positioned at presettable positions along said front side so that the tuning frequency point selected by the respective pushbutton is freely presettable. The operative member must have at least such a V-shaped cutout width that make possible moving the related pin of the slider by the maximum moving distance of the slider within the rear portion of the V-shaped cutout of the operative member which is in the unoperative position.

This invention provides an improved pushbutton tuner having the reduced size, but without any deterioration of its operation quality by the new structure of the mechanism thereof over the prior art.

DETAILED DESCRIPTION OF THE PREFERRED EMBODIMENTS

Figure 1:
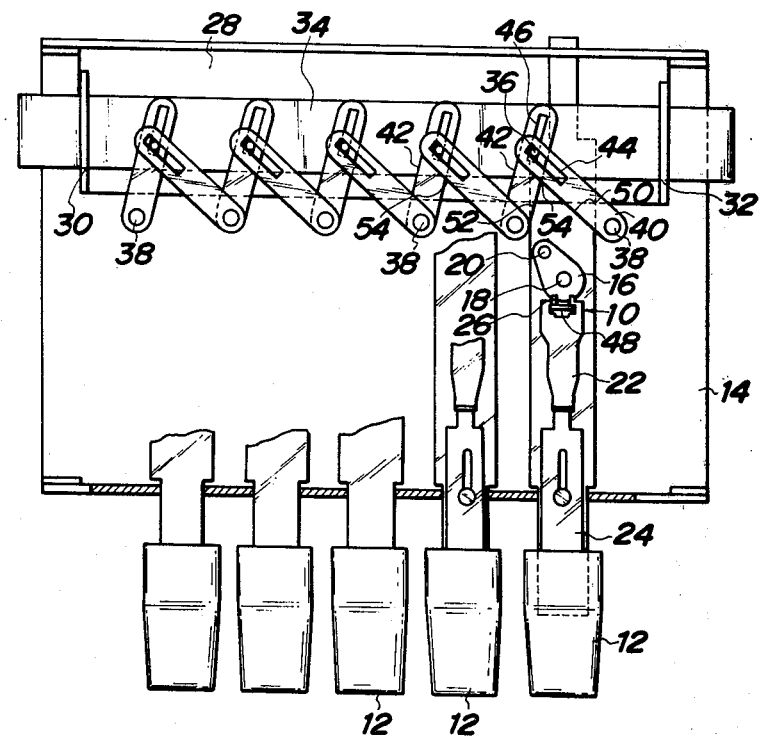
FIGS. 1 and 2 are plan and section views of a pushbutton tuner of a first embodiment of the invention.
Figure 2:
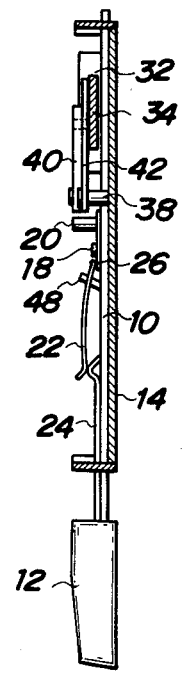

According to FIGS. 1 and 2 which show one embodiment of this invention, an operative member 10 to the forward end of which is attached a pushbutton 12 is slidably mounted on a tuner base 14 in parallel thereto, and a frequency defining plate 16 is pivotally mounted on the operative member 10 by a pin 18. Each frequency defining plate 16 has one engaging pin 20. Since the frequency defining plate 16 is mounted on the operative member 10 so as to be parallel thereto, it is also parallel to the tuner base 14. Each operative member carries a spring plate 22 for clamping or locking the frequency defining plate 16 on the operative member 10 in an adjusted position as well as a plate 24 attached to the pushbutton 12. The spring plate 22 presses against the front end of said spring plate 22 to aid a clamping action thereof. Each spring plate 22 is also parallel to the tuner base 14. When the pushbutton is pulled from the unoperative position, the plate 24 moves together with the pushbutton and releases the clamping force of the plate 22 on the frequency defining plate 16, to provide a state where the position of the engaging pin 20 can be preset. From this state, when the pushbutton is depressed the plate 24 causes the spring plate 22 to clamp the frequency defining plate 16 at the rear pressing end 26 thereof. According to this arrangement, as shown, a guiding plate 28 is attached to the end of the base 14 opposite to that where the plurality of pushbuttons 12 are arranged in a side-by-side relation, and a slider 34 is slidably mounted through guide holes 30 and 32 provided on both ends of said guiding plate 28, and pins 36 are mounted on this slider 34 with a space corresponding to the distance between the adjacent operative members 10. Each pin 36 is received in slots 44 and 46 respectively in a pair of links 40 and 42, which slots are sufficiently long to cover the tuning core stroke. Links 40 and 42 are pivotally mounted on the tuner base 14 by pivot pins 38 and extend over the associated operative member 10. Each intermediate link 42 is jointed by the same pivot pin 38 to the link 40 crossing the adjacent operative member over which it does not extend. Reference numeral 48 identifies a member for engaging the spring plate 22 on each operative member 10. As conventionally known, spring means, such as a coil spring (not shown) is employed for biasing the operative member 10 into an initial unoperative position shown in FIG. 1. In FIG. 1, the slider 34 is operatively coupled to tuning frequency point determination means.

The operative of the above described arrangement is now explained: While the frequency defining plates 16 are clamped and restrained on the operative members 10 in a predetermined relationship, when a button 12 is depressed, the associated engaging pin 20 is engaged with the inside edge 50 or 52 of either of the links 40 and 42 to rotate the thus pivot link 40 or 42 around its pivot pin 38; with either link 40 or 42 being thus oriented, the slider pin 36 passing through these links is moved either to the right or left along with the slider and, accordingly, the other pair of links 40–42 are pulled by the slider into corresponding positions at the same time. In other words, by the action of the engaging pin 20 that is moved in the direction of a linearly moving operative member 10, the link 40 or 42 that is engaged with said pin is moved in such a direction that it is made parallel to the operative member 10, and the other links that are moved by the movement of the slider pins 36 are made to rotate in a similar manner. Such movements of the links 40 and 42 are stopped when the crossing point 54 of the inside edges of the two links is at the position where it is in line with the path of the movement of the engaging pin 20. As the engaging pin 20 continues to be pushed forward, one of the links 40 and 42 will continue its rotational movement around the pivotal pin 38, but such movement of either of the two links is inevitably stopped because the other link rotates in opposite direction and the engaging pin 20 is fit to the crossing point 54 of the inside edges of the two links 40 and 42 as a result of the crossing point 54 being brought in line with the path of the movement of the engaging pin 20; thus, one link 40 or 42 acts as a stopper of the rotational movement of the other link 42 or 40. As the Figures show, the two links 40 and 42 are of the same shape and dimensions. Instead of mounting each operative member in contact with the tuner base as shown in FIG. 2, it may be disposed on top of of the two links 40 and 42 so that the frequency defining plate is positioned beneath the same. In either case, the engaging pin 20 contacts with either of the links 40 and 42 intermediate of the pivotal pin 38 and the pin 36 so as to rotate said links. The pins 36 are spaced a relatively long distance from the pivot pins 38 so that a relatively large operation stroke of the slider is provided, and, thus, a relatively small movement of the engaging pin 20 can provide a longer core stroke.

As described above, according to this invention, not only the operative member 10 but also the frequency defining slider, the spring plate 22, the lock plate 24 and each of the links 40–42 are disposed parallel to the tuner base 14. Therefore, the resulting mechanism for tuning operation can be made very thin. For example, a pushbutton type tuner having a thickness of about 10 mm can be designed. In addition, the overall construction can be greatly simplified and its scale made very small because only one engaging pin 20 need be disposed on the frequency defining plate and the links 40 and 42 may be provided with a very compact configuration. Further, a large core stroke obtained by the engaging pin 20 allows the cores to be effectively inserted in and extracted from the coils, and in addition to that, since, as mentioned earlier, one of the two links acts as a stopper of the movement of the other link, a desired state of broadcasting station selection and tuning can invariably be obtained with great accuracy.

What is claimed is:

1. In a pushbutton tuner including support means, a plurality of operative means each having a pushbutton connected thereto and positioned on said support means with the associated operative means for similar movement from an inoperative position to an operative position upon depression of the pushbutton, and tuning means positioned on said support means for movement in a direction transverse to the direction of movement of the operative means, the improvement comprising: linkage means responsive to the depression of any selected one of said pushbuttons for moving said tuning means in said transverse direction a distance which varies with the particular pushbutton which is depressed, said linkage means comprising a pair of links associated with each operative means, each pair of links being supported for pivotal movement about parallel pivot axes spaced apart in a direction parallel to said transverse direction, the free end portions of each pair of links overlapping one another and each having elongated slots receiving a projection extending from said tuning means so that as each pair of links assumes different relative angular positions with respect to the associated pivot points the tuning means has a different corresponding position, and there is associated with each of said operative means adjustable tuning control means for engaging at least one of the confronting edges of the associated pair of links when the associated pushbutton is fully depressed, each of said adjustable control means being lockably adjustable in position in a direction parallel to said transverse direction of movement of said tuning means and so that upon full depression of the associated pushbutton the tuning control means will first engage at least one confronting link edge to pivot the associated links when the pushbutton is partially depressed and upon further depression of the associated pushbutton will slide along the latter edge until it reaches the point of intersection between said confronting edges where further pivotal movement of the links is terminated.

2. The pushbutton tuner of claim 1 wherein said plurality of operative means are parallel members mounted in juxtaposed relation for parallel rectilinear movement, said pushbutton being secured to the outer ends of said members and said pairs of links being in juxtaposed relation at the inner ends of said members.

3. The pushbutton tuner of claim 1 wherein the adjacent links of adjacent ones of said pairs of links are pivoted to said support means along a common pivot axis.

4. The pushbutton tuner of claim 1 wherein said tuning control means associated with each operative means projects from a member pivotally mounted upon the associated operative means and is lockable into any adjusted position thereof.

5. The pushbutton tuner of claim 1 wherein said tuning means is a thin plate-like member whose thin dimension extends in a direction parallel to the direction of movement of said operative means, each of said links in a thin plate-like member in a plane parallel to the plane of said tuning means, and each of said operative means includes a thin plate-like member in a plane parallel to the planes of said tuning means and links, said parallel tuning means, links and operative means being contiguous to form a compact assembly.

* * * * *